(12) United States Patent
Wang et al.

(10) Patent No.: US 12,471,373 B2
(45) Date of Patent: Nov. 11, 2025

(54) ARRAY SUBSTRATE AND DISPLAY PANEL (71) Applicant: BOE Technology Group Co., Ltd., Beijing (CN)

(72) Inventors: Lizhong Wang, Beijing (CN); Ce Ning, Beijing (CN); Tianmin Zhou, Beijing (CN); Wei Yang, Beijing (CN); Yunping Di, Beijing (CN); Rui Huang, Beijing (CN); Binbin Tong, Beijing (CN); Liping Lei, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 390 days.

(21) Appl. No.: 17/919,547

(22) PCT Filed: Nov. 17, 2021

(86) PCT No.: PCT/CN2021/131314
§ 371 (c)(1),
(2) Date: Oct. 18, 2022

(87) PCT Pub. No.: WO2022/193702
PCT Pub. Date: Sep. 22, 2022

(65) Prior Publication Data
US 2023/0163143 A1    May 25, 2023

(30) Foreign Application Priority Data
Mar. 19, 2021   (CN) .......................... 202120565402.1

(51) Int. Cl.
*H10D 86/60*    (2025.01)
*G02F 1/1362*   (2006.01)
(Continued)

(52) U.S. Cl.
CPC ....... *H10D 86/60* (2025.01); *G02F 1/136209* (2013.01); *G02F 1/136295* (2021.01);
(Continued)

(58) Field of Classification Search
CPC ............. H01L 27/1251; H01L 27/1225; H01L 27/124; H01L 27/1222; H01L 29/78696;
(Continued)

(56) References Cited

U.S. PATENT DOCUMENTS 7,161,193 B2    1/2007  Kawata et al.
7,268,843 B2    9/2007  Kawata et al.
(Continued)

FOREIGN PATENT DOCUMENTS

CN    105470205 A  *  4/2016
CN    106531692 A     3/2017
(Continued)

OTHER PUBLICATIONS

International Search Report and Written Opinion mailed on Feb. 11, 2022, in corresponding PCT/CN2021/131314, 10 pages.

*Primary Examiner* — Jennifer D. Carruth
*Assistant Examiner* — Agnes Dobrowolski
(74) *Attorney, Agent, or Firm* — XSENSUS LLP (57) ABSTRACT

An array substrate and a display panel, relating to the technical field of display. The array substrate includes a base substrate, and a thin film transistor group which is provided on one side of the base substrate and includes at least two thin film transistors, the thin film transistors being stacked in a direction perpendicular to the base substrate.

20 Claims, 7 Drawing Sheets

(51) Int. Cl.
*G02F 1/1368* (2006.01)
*H10D 86/40* (2025.01)

(52) U.S. Cl.
CPC ....... *G02F 1/13685* (2021.01); *H10D 86/423* (2025.01); *H10D 86/441* (2025.01); *H10D 86/471* (2025.01)

(58) Field of Classification Search
CPC ......... G02F 1/136209; G02F 1/136295; G02F 1/13685; G02F 1/13624; G02F 1/1368
See application file for complete search history.

(56) References Cited

U.S. PATENT DOCUMENTS

| | | | |
|---|---|---|---|
| 10,490,670 B2 | 11/2019 | Li et al. | |
| 10,741,626 B1 | 8/2020 | Zhang et al. | |
| 11,201,179 B2 | 12/2021 | Ren et al. | |
| 2004/0141130 A1 | 7/2004 | Kawata et al. | |
| 2005/0199889 A1 | 9/2005 | Kawata et al. | |
| 2019/0013409 A1* | 1/2019 | Li | H01L 29/78645 |
| 2020/0279899 A1 | 9/2020 | Zhang et al. | |
| 2021/0091123 A1 | 3/2021 | Ren et al. | |
| 2021/0343756 A1* | 11/2021 | Chung | H10K 59/1213 |
| 2021/0367022 A1* | 11/2021 | Tang | H10K 59/1216 |

FOREIGN PATENT DOCUMENTS

| | | |
|---|---|---|
| CN | 105470205 B | 9/2018 |
| CN | 109742131 A | 5/2019 |
| CN | 109828395 A | 5/2019 |
| CN | 110581144 A | 12/2019 |
| CN | 112068372 A | 12/2020 |
| JP | 2004-170911 A | 6/2004 |

* cited by examiner

ARRAY SUBSTRATE AND DISPLAY PANEL

CROSS REFERENCE

The present disclosure is a U.S. national phase application of International Application No. PCT/CN2021/131314, filed on Nov. 17, 2021, which claims priority to Chinese Patent Application No. 202120565402.1, filed on Mar. 19, 2021 and entitled "ARRAY SUBSTRATE AND DISPLAY PANEL", and the entire content thereof is incorporated herein by reference.

TECHNICAL FIELD

The present disclosure relates to the field of display technology, and in particular, to an array substrate and a display panel.

BACKGROUND

With the popularization of AR (Augmented Reality)/VR (Virtual Reality) products, demands for displays with high PPI (Pixels Per Inch, pixel density) and high aperture ratio are increasing. The aperture ratio refers to the ratio between an area of a light passing portion after removing a wiring portion and a transistor portion (usually hidden by a black matrix) of each sub-pixel and an entire area of each sub-pixel. The larger the aperture ratio is, the higher the light passing efficiency is. In the related art, the aperture ratio of the display needs to be further improved.

It should be noted that the information disclosed in above section is only for enhancement of understanding of the background of the present disclosure, and therefore may contain information that does not form the prior art already known to a person of ordinary skill in the art.

SUMMARY

The purpose of the present disclosure is to provide an array substrate and a display panel.

According to one aspect of the present disclosure, an array substrate is provided, which includes:
a base substrate; and
a thin film transistor group arranged on a side of the base substrate, wherein the thin film transistor group comprises at least two thin film transistors, and the thin film transistors are stacked in a direction perpendicular to the base substrate.

In some exemplary embodiments of the present disclosure, the thin film transistor group includes:
a first thin film transistor arranged on a side of the base substrate; and
a second thin film transistor arranged on a side of the first thin film transistor away from the base substrate.

In some exemplary embodiments of the present disclosure, the first thin film transistor includes:
a first gate layer arranged on a side of the base substrate, wherein the first gate layer comprises a first gate;
a first gate insulating layer arranged on a side of the first gate layer away from the base substrate, wherein the first gate insulating layer covers a surface of the first gate layer;
a first active layer arranged on a side of the first gate insulating layer away from the base substrate; and
a first source and drain layer comprising a first pole covering one end of the first active layer and a second pole covering the other end of the first active layer.

In some exemplary embodiments of the present disclosure, the second thin film transistor includes:
a second gate layer arranged on a side of the first thin film transistor away from the base substrate, wherein the second gate layer comprises a second gate;
a second gate insulating layer arranged on a side of the second gate layer away from the base substrate, wherein the second gate insulating layer covers a surface of the second gate layer;
a second active layer arranged on a side of the second gate insulating layer away from the base substrate; and
a second source and drain layer comprising a third pole covering one end of the second active layer and a fourth pole covering the other end of the second active layer, wherein orthographic projections of the third pole and the first pole on the base substrate at least partially overlap, orthographic projections of the fourth pole and the second pole on the base substrate at least partially overlap, and the orthographic projection of the second pole on the base substrate is located at least partially outside an orthographic projection of the second thin film transistor on the base substrate.

In some exemplary embodiments of the present disclosure, the first thin film transistor includes:
a shielding layer arranged on a side of the base substrate;
a first active layer arranged on a side of the shielding layer away from the base substrate;
a first gate insulating layer arranged on a side of the first active layer away from the base substrate;
a first gate layer arranged on a side of the first gate insulating layer away from the base substrate, wherein the first gate layer comprises a first gate;
a first interlayer insulating layer arranged on a side of the first gate layer away from the base substrate, wherein the first interlayer insulating layer covers a surface of the first gate layer away from the base substrate, and the first interlayer insulating layer covers side surfaces of the first gate layer and the first gate insulating layer; and
a first source and drain layer comprising a first pole and a second pole, wherein the first pole covers a part of a surface of the first interlayer insulating layer away from the base substrate, passes through the first interlayer insulating layer, and is connected to one end of the first active layer; the second pole covers a part of the surface of the first interlayer insulating layer away from the base substrate, passes through the first interlayer insulating layer, and is connected to the other end of the first active layer.

In some exemplary embodiments of the present disclosure, the second thin film transistor includes:
a second active layer arranged on a side of the first thin film transistor away from the base substrate;
a second gate insulating layer arranged on a side of the second active layer away from the base substrate;
a second gate layer arranged on a side of the second gate insulating layer away from the base substrate, wherein the second gate layer comprises a second gate;
a second interlayer insulating layer arranged on a side of the second gate layer away from the base substrate, wherein the second interlayer insulating layer covers a surface of the second gate layer away from the base substrate, and the second interlayer insulating layer covers side surfaces of the second gate layer and the second gate insulating layer; and
a second source and drain layer comprising a third pole and a fourth pole, wherein the third pole covers a part of a surface of the second interlayer insulating layer away from the base substrate, passes through the second interlayer insulating layer, and is connected to one end of the second active layer; the fourth pole covers a part of the surface of the second interlayer insulating layer away from the base substrate, passes through the second interlayer insulating layer, and is connected to the other end of the second active layer; projections of the third pole and the first pole on the base substrate at least partially overlap, and an orthographic projection of the second pole on the base substrate is located at least partially outside an orthographic projection of the second thin film transistor on the base substrate.

In some exemplary embodiments of the present disclosure, the thin film transistor group further includes:
a first passivation layer arranged between the first thin film transistor and the second thin film transistor, and arranged on a side of the first source and drain layer away from the base substrate; and
a first planarization layer arranged on a side of the first passivation layer away from the base substrate.

In some exemplary embodiments of the present disclosure, the thin film transistor group further includes:
a second passivation layer arranged on a side of the second source and drain layer away from the base substrate; and
a second planarization layer arranged on a side of the second passivation layer away from the base substrate.

In some exemplary embodiments of the present disclosure, the array substrate further includes:
a first scan line arranged in the same layer as the first gate layer, and connected to the first gate;
a second scan line arranged in the same layer as the second gate layer, and connected to the second gate;
a first data line arranged in the same layer as the first source and drain layer, and connected to the first pole; and
a second data line arranged in the same layer as the second source and drain layer, and connected to the third pole or the fourth pole.

In some exemplary embodiments of the present disclosure, orthographic projections of the first scan line and the second scan line on the base substrate at least partially overlap, and orthographic projections of the first data line and the second data line on the base substrate at least partially overlap.

In some exemplary embodiments of the present disclosure, the first scan line, the second scan line, the first data line or the second data line are transparent metal lines.

In some exemplary embodiments of the present disclosure, the first active layer comprises a first subsection and a second subsection, the first subsection and the second subsection have a first included angle, the first subsection is connected to the first pole, and the second subsection is connected to the second pole.

In some exemplary embodiments of the present disclosure, the second active layer comprises a third subsection and a fourth subsection, the third subsection and the fourth subsection have a second included angle, the third subsection is connected to the third pole, the fourth subsection is connected to the fourth pole, and orthographic projections of the second active layer and the first active layer on the base substrate at least partially overlap.

In some exemplary embodiments of the present disclosure, materials of the first active layer and the second active layer comprise IGZO.

According to another aspect of the present disclosure, a display panel is provided, which includes:

the array substrate according to above aspects;
a plurality of pixel electrodes arranged on a side of the thin film transistor group away from the base substrate, wherein each of the pixel electrodes is connected to one of the thin film transistors;
a liquid crystal layer arranged on a side of the pixel electrodes away from the base substrate; and
a color film substrate arranged on a side of the liquid crystal layer away from the base substrate.

According to another aspect of the present disclosure, a display panel is provided, which includes:
the array substrate according to above aspects; and
a light-emitting device layer arranged on a side of the thin film transistor group away from the base substrate, wherein the light-emitting device layer comprises a plurality of light-emitting devices, and each of the light-emitting devices is connected to one of the thin film transistors.

According to another aspect of the present disclosure, a method for fabricating an array substrate is provided, which includes:
providing a base substrate; and
forming a thin film transistor group on a side of the base substrate, wherein the thin film transistor group includes at least two thin film transistors, and the thin film transistors are stacked in a direction perpendicular to the base substrate.

In some exemplary embodiments of the present disclosure, forming a thin film transistor group on a side of the base substrate includes:
forming a first thin film transistor on a side of the base substrate; and
forming a second thin film transistor on a side of the first thin film transistor away from the base substrate.

In some exemplary embodiments of the present disclosure, forming a first thin film transistor on a side of the base substrate includes:
forming a first gate layer on a side of the base substrate, wherein the first gate layer includes a first gate;
forming a first gate insulating layer on a side of the first gate layer away from the base substrate, wherein the first gate insulating layer covers a surface of the first gate layer;
forming a first active layer on a side of the first gate insulating layer away from the base substrate; and
forming a first source and drain layer on a side of the first active layer away from the base substrate, wherein the first source and drain layer includes a first pole covering one end of the first active layer and a second pole covering the other end of the first active layer.

In some exemplary embodiments of the present disclosure, forming a second thin film transistor on a side of the first thin film transistor away from the base substrate includes:
forming a second gate layer on a side of the first thin film transistor away from the base substrate, wherein the second gate layer includes a second gate;
forming a second gate insulating layer on a side of the second gate layer away from the base substrate, wherein the second gate insulating layer covers a surface of the second gate layer;
forming a second active layer on a side of the second gate insulating layer away from the base substrate; and
forming a second source and drain layer on a side of the second active layer away from the base substrate, wherein the second source and drain layer includes a third pole covering one end of the second active layer and a fourth pole covering the other end of the second active layer; orthographic projections of the third pole and the first pole on the base substrate at least partially overlap, orthographic projections of the fourth pole and the second pole on the base substrate at least partially overlap, and the orthographic projection of the second pole on the base substrate is located at least partially outside an orthographic projection of the second thin film transistor on the base substrate.

It is to be understood that the foregoing general description and the following detailed description are exemplary and explanatory only and are not restrictive of the present disclosure.

BRIEF DESCRIPTION OF THE DRAWINGS

The drawings, which are incorporated in and constitute a part of this specification, illustrate embodiments consistent with the present disclosure and serve together with the specification to explain the principles of the present disclosure. It is apparent that the drawings in the following description are only some embodiments of the present disclosure, and for those of ordinary skill in the art, other drawings can also be obtained from these drawings without creative efforts.

The main components in the figure are described as follows:

1—base substrate; 2—thin film transistor group; 100—first gate layer; 200—first gate insulating layer; 300—first active layer; 310—first subsection; 320—second subsection; 410—first pole; 420—second pole; 500—second gate layer; 600—second gate insulating layer; 700—second active layer; 710—third subsection; 720—fourth subsection; 810—third pole; 820—fourth pole; 900—shielding layer; 10—first passivation layer; 20—first planarization layer; 30—second passivation layer; 40—second planarization layer; 50—first scan line; 60—second scan line; 70—first data line; 80—second data line; 3—pixel electrode; 4—liquid crystal layer; 5—color film substrate; 6—light emitting device.

DETAILED DESCRIPTION

Example embodiments will now be described more comprehensively with reference to the drawings. However, the example embodiments can be implemented in various ways and should not be construed as limited to the embodiments set forth herein. Instead, these embodiments are provided so that the present disclosure will be thorough and complete, and will fully convey the concept of example embodiments to those skilled in the art. The same reference signs in the drawings denote the same or similar structures, and thus their detailed descriptions will be omitted. Furthermore, the drawings are merely schematic illustrations of the present disclosure and are not necessarily drawn to scale.

In the drawings, a thickness of a region or a layer may be exaggerated for clarity. The same reference numerals in the drawings denote the same or similar structures, and thus their detailed descriptions will be omitted.

The described features, structures, or characteristics may be combined in any suitable manner in one or more embodiments. In the following descriptions, many specific details are provided in order to give a thorough understanding of embodiments of the present disclosure. However, those skilled in the art will appreciate that technical solutions of the present disclosure may be practiced without one or more of these specific details, or other methods, components, materials, etc., may be employed. In other instances, well-known structures, materials, or operations are not shown or described in detail to avoid obscuring the main technical concept of the present disclosure.

When a structure is "on" an other structure, it may mean that the structure is integrally formed on the other structure, or that the structure is "directly" arranged on the other structure, or that the structure is "indirectly" arranged on the other structure through another structure.

Terms "a", "an", "the" are used to indicate presence of one or more elements/components/etc. Terms "include" and "have" are used to indicate an open-ended inclusion and refer to presence of additional elements/components/etc., in addition to the listed elements/components/etc. Terms "first" and "second", etc., are used only as labels and are not intended to limit the number of objects.

A liquid crystal displays (LCD) and an organic electroluminescence display (OLED) are commonly used displays today. In the related art, both the liquid crystal display and the organic electroluminescence display include an array substrate. The array substrate includes a multiple layers of driving circuit layers, each drive circuit layer includes multiple driving circuits, and each driving circuit drives a liquid crystal pixel or a light-emitting device correspondingly. Each driving circuit includes a driving transistor for driving the liquid crystal pixel or the light-emitting device. In the related art, the driving transistors in different driving circuits corresponding to different pixels or light-emitting devices are all designed in the same layer, resulting in large occupied area, and high light blocking rate, which is not conducive to the improvement of the aperture ratio.

Figure 1:
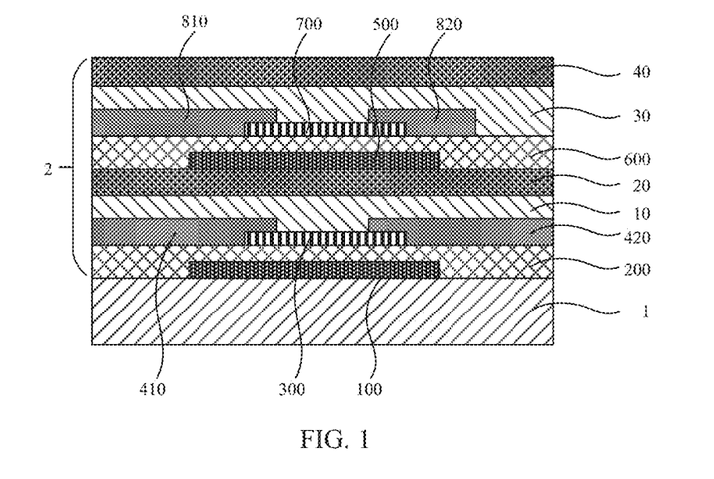
FIG. 1 is a schematic structural diagram of an array substrate according to an exemplary embodiment of the present disclosure.
Figure 2:
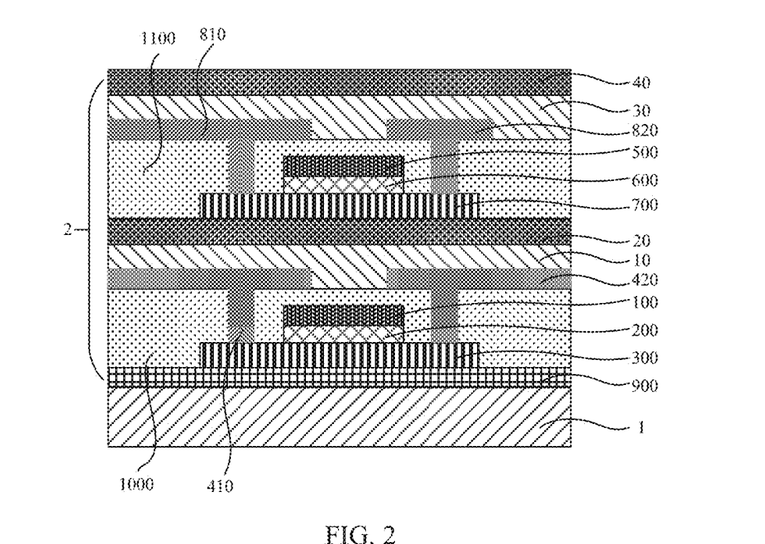
FIG. 2 is a schematic structural diagram of an array substrate according to another exemplary embodiment of the present disclosure.

As shown in FIGS. 1 and 2, embodiments of the present disclosure provide an array substrate, which includes a base substrate 1 and a thin film transistor group 2. The thin film transistor group 2 is provided on a side of the base substrate 1, and the thin film transistor group 2 includes at least two thin film transistors. The thin film transistors are stacked in a direction perpendicular to the base substrate 1.

The array substrate provided by embodiments of the present disclosure includes a thin film transistor group 2, and the thin film transistor group 2 includes at least two thin film transistors. The thin film transistors are stacked in a direction perpendicular to the base substrate 1, that is, orthographic projections of a plurality of thin film transistors on the base substrate 1 at least partially overlap. In embodiments of the present disclosure, the thin film transistors are designed in stacked layers to reduce the occupied area of the thin film transistors on a plane, thereby facilitating improving the light transmittance and the aperture ratio.

The array substrate provided by embodiments of the present disclosure can be used in liquid crystal displays, organic electroluminescence displays, and the like. Each thin film transistor stacked in the thin film transistor group 2 drives different liquid crystal pixels or light emitting devices respectively. Compared with the arrangement in the same layer in the related art, the light transmittance and the aperture ratio of the array substrate provided by embodiments of the present disclosure are higher.

The components of the array substrate provided by embodiments of the present disclosure will be described in detail in the following with reference to the drawings.

As shown in FIGS. 1 and 2, the array substrate includes a base substrate 1 and a thin film transistor group 2. The base substrate 1 may be a base substrate 1 made of an inorganic material, or may be a base substrate 1 made of an organic material. For example, in some embodiments of the present disclosure, the material of the base substrate 1 may be glass materials such as soda-lime glass, quartz glass, sapphire glass, etc., or may be metal materials such as stainless steel, aluminum, nickel, etc. In some other embodiments of the present disclosure, the material of the base substrate 1 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), Polyethylene naphthalate (PEN) or a combination thereof. The base substrate 1 may also be a flexible base substrate 1. For example, in some embodiments of the present disclosure, the material of the base substrate 1 may be polyimide (PI). The base substrate 1 may also be a composite of multiple layers of materials. For example, in some embodiments of the present disclosure, the base substrate 1 may include a bottom film layer, a pressure-sensitive adhesive layer, a first polyimide layer and a second polyimide layer stacked in sequence.

The thin film transistor group 2 is arranged on a side of the base substrate 1, the thin film transistor group 2 includes at least two thin film transistors, and the thin film transistors are stacked in a direction perpendicular to the base substrate 1. The number of thin film transistors included in the thin film transistor group 2 is not limited. In some embodiments, the thin film transistor group 2 includes two thin film transistors, so as to improve the aperture ratio of the display panel without increasing the thickness of the display panel. The thin film transistor group 2 is used to drive the pixels of the LCD display panel or the light-emitting device 6 of the OLED display panel. The thin film transistors stacked in the thin film transistor group 2 are driving transistors, and each driving transistor can drive different pixels or light-emitting devices. For example, when the thin film transistor group 2 includes two stacked thin film transistors, the two thin film transistors can drive two adjacent pixels or light-emitting devices.

In some exemplary embodiments of the present disclosure, the thin film transistor group 2 includes a first thin film transistor and a second thin film transistor. The first thin film transistor is arranged on a side of the base substrate 1, and the second thin film transistor is arranged on a side of the first thin film transistor away from the base substrate 1. Orthographic projections of the second thin film transistor and the first thin film transistor on the base substrate 1 at least partially overlap. The first thin film transistor and the second thin film transistor are driving transistors in the driving circuit of the array substrate. The first thin film transistor is used to drive one pixel or one light-emitting device, and the second thin film transistor is used to drive another pixel or light-emitting device. The first thin film transistor and the second thin film transistor may have a bottom gate structure or a top gate structure.

As shown in FIG. 1, in some embodiments of the present disclosure, the first thin film transistor and the second thin film transistor have bottom gate structures. The first thin film transistor includes a first gate layer 100, a first gate insulating layer 200, a first active layer 300 and a first source and drain layer. The first gate layer 100 is arranged on a side of the base substrate 1, and the first gate layer 100 includes a first gate. The first gate can be made of metal materials such as aluminum, copper, or molybdenum. The first gate insulating layer 200 is arranged on a side of the first gate layer 100 away from the base substrate 1, and the first gate insulating layer 200 covers a surface of the first gate layer 100. The first gate insulating layer 200 may be a single film layer made of silicon nitride, silicon oxide, aluminum oxide, etc., or a multi-film layer formed by a combination of above. The first active layer 300 is arranged on a side of the first gate insulating layer 200 away from the base substrate 1. The first active layer 300 may be made of IGZO (Indium Gallium Zinc Oxide). The first source and drain layer includes a first pole 410 covering one end of the first active layer 300 and a second pole 420 covering the other end of the first active layer 300. The first pole 410 and the second pole 420 area source and a drain.

The second thin film transistor includes a second gate layer 500, a second gate insulating layer 600, a second active layer 700 and a second source and drain layer. The second gate layer 500 is arranged on a side of the first thin film transistor away from the base substrate 1, and the second gate layer 500 includes a second gate. The second gate can be made of metal materials such as aluminum, copper, or molybdenum. The second gate insulating layer 600 is arranged on a side of the second gate layer 500 away from the base substrate 1, and the second gate insulating layer 600 covers a surface of the second gate layer 500. The second gate insulating layer 600 may be a single film layer made of silicon nitride, silicon oxide, aluminum oxide, etc., or a multi-film layer formed by a combination of above. The second active layer 700 is arranged on a side of the second gate insulating layer 600 away from the base substrate 1. The second active layer 700 may be made of IGZO (Indium Gallium Zinc Oxide). The second source and drain layer includes a third pole 810 covering one end of the second active layer 700 and a fourth pole 820 covering the other end of the second active layer 700. The third pole 810 and the fourth pole 820 are a source and a drain. The third pole 810 may be a source or a drain, and the fourth pole 820 may be correspondingly a drain or a source. The third pole 810 and the first pole 410 are located opposite to each other, and the fourth pole 820 and the second pole 420 are located opposite to each other. Orthographic projections of the third pole 810 and the first pole 410 on the base substrate 1 at least partially overlap, orthographic projections of the fourth pole 820 and the second pole 420 on the base substrate 1 at least partially overlap, and the orthographic projection of the second pole 420 on the base substrate 1 is located at least partially outside an orthographic projection of the second thin film transistor on the base substrate 1. The second pole 420 (i.e., the drain) of the first thin film transistor is configured to be connected to the pixel electrode of the LCD display panel or the anode of the OLED display panel. In such structure, the orthographic projection of the second pole 420 on the base substrate 1 is located outside the orthographic projection of the second thin film transistor on the base substrate 1, so that the second pole 420 cannot be blocked when the second pole 420 is connected to the pixel electrode of the LCD display panel or the anode of the OLED display panel.

As shown in FIG. 2, in some other embodiments of the present disclosure, the first thin film transistor and the second thin film transistor have top gate structures. The first thin film transistor includes a shielding layer 900, a first active layer 300, a first gate insulating layer 200, a first gate layer 100, a first interlayer insulating layer 1000, and a first source and drain layer. The shielding layer 900 is arranged on a side of the base substrate 1. The shielding layer 900 can be made of black organic materials, or metal or alloy with high reflection and low light transmittance. The first active layer 300 is arranged on a side of the shielding layer 900 away from the base substrate 1. The first active layer 300 may be made of IGZO (Indium Gallium Zinc Oxide). The first gate insulating layer 200 is arranged on a side of the first active layer 300 away from the base substrate 1. The first gate insulating layer 200 may be a single film layer made of silicon nitride, silicon oxide, aluminum oxide, etc., or a multi-film layer formed by a combination of above. The first gate layer 100 is arranged on a side of the first gate insulating layer 200 away from the base substrate 1, and the first gate layer 100 includes a first gate. The first gate can be made of metal materials such as aluminum, copper, or molybdenum. The first interlayer insulating layer 1000 is arranged on a side of the first gate layer 100 away from the base substrate 1, the first interlayer insulating layer 1000 covers a surface of the first gate layer 100 away from the base substrate 1, and the first interlayer insulating layer 1000 covers side surfaces of the first gate layer 100 and the first gate insulating layer 200. The first interlayer insulating layer 1000 can be a single film layer made of silicon nitride, silicon oxide, aluminum oxide, etc., or a multi-film layer formed by a combination of above. The first source and drain layer includes a first pole 410 and a second pole 420, and the first pole 410 and the second pole 420 are a source and a drain. The first pole 410 covers a part of a surface of the first interlayer insulating layer 1000 away from the base substrate 1, passes through the first interlayer insulating layer 1000 and is connected to one end of the first active layer 300. The second pole 420 covers a part of a surface of the first interlayer insulating layer 1000 away from the base substrate 1, passes through the first interlayer insulating layer 1000 and is connected to the other end of the first active layer 300.

The second thin film transistor includes a second active layer 700, a second gate insulating layer 600, a second gate layer 500, a second interlayer insulating layer 1100, and a second source and drain layer. The second active layer 700 is arranged on a side of the first thin film transistor away from the base substrate 1. The second active layer 700 can be made of materials such as IGZO (Indium Gallium Zinc Oxide). The second gate insulating layer 600 is arranged on a side of the second active layer 700 away from the base substrate 1. The second gate insulating layer 600 may be a single film layer made of silicon nitride, silicon oxide, aluminum oxide, etc. or a multi-film layer formed by a combination of above. The second gate layer 500 is arranged on a side of the second gate insulating layer 600 away from the base substrate 1, and the second gate layer 500 includes a second gate. The second gate can be made of metal materials such as aluminum, copper, or molybdenum. The second interlayer insulating layer 1100 is arranged on a side of the second gate layer 500 away from the base substrate 1, the second interlayer insulating layer 1100 covers a surface of the second gate layer 500 away from the base substrate 1, and the second interlayer insulating layer 1100 covers side surfaces of the second gate layer 500 and the second gate insulating layer 600. The second interlayer insulating layer 1100 can be a single film layer made of silicon nitride, silicon oxide, aluminum oxide, etc., or a multi-film layer formed by a combination of above. The second source and drain layer includes a third pole 810 and a fourth pole 820, and the third pole 810 and the fourth pole 820 are a source and a drain. The third pole 810 and the first pole 410 are located opposite to each other, and the fourth pole 820 and the second pole 420 are located opposite to each other. The third pole 810 covers a part of a surface of the second interlayer insulating layer 1100 away from the base substrate 1, passes through the second interlayer insulating layer 1100 and is connected to one end of the second active layer 700. The fourth pole 820 covers a part of a surface of the second interlayer insulating layer 1100 away from the base substrate 1, passes through the second interlayer insulating layer 1100 and is connected to the other end of the second active layer 700. Orthographic projections of the third pole 810 and the first pole 410 on the base substrate 1 at least partially overlap, and the orthographic projection of the second pole 420 on the base substrate 1 is located at least partially outside the orthographic projection of the second thin film transistor on the base substrate 1. The second pole 420 (i.e., the drain) of the first thin film transistor is configured to be connected to the pixel electrode 3 of the LCD display panel or the anode of the OLED display panel. In such structure, the orthographic projection of the second pole 420 on the base substrate 1 is located outside the orthographic projection of the second thin film transistor on the base substrate 1, so that the second pole 420 cannot be blocked when the second pole 420 is connected to the pixel electrode 3 of the LCD display panel or the anode of the OLED display panel.

As shown in FIGS. 1 and 2, the thin film transistor group 2 further includes a first passivation layer 10 and a first planarization layer 20. The first passivation layer 10 is arranged between the first thin film transistor and the second thin film transistor, and the first passivation layer 10 is arranged on a side of the first source and drain layer away from the base substrate 1. The first passivation layer 10 can be made of silicon oxide, silicon oxynitride and other materials. The first planarization layer 20 is arranged on a side of the first passivation layer 10 away from the base substrate 1. The first planarization layer 20 can be made of resin materials.

The thin film transistor group 2 further includes a second passivation layer 30 and a second planarization layer 40. The second passivation layer 30 is arranged on a side of the second source and drain layer away from the base substrate 1. The second passivation layer 30 can be made of silicon oxide, silicon oxynitride and other materials. The second planarization layer 40 is arranged on a side of the second passivation layer 30 away from the base substrate 1. The second planarization layer 40 can be made of resin materials.

Figure 3:
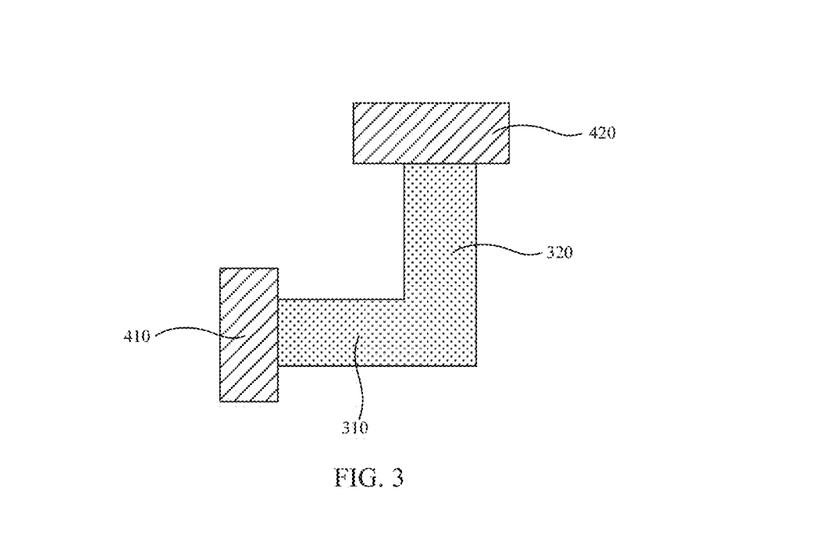
FIG. 3 is a schematic diagram of a planar structure of a first active layer according to an exemplary embodiment of the present disclosure.

As shown in FIG. 3, the first active layer 300 includes a first subsection 310 and a second subsection 320. The first subsection 310 and the second subsection 320 have a first included angle. The first subsection 310 is connected to the first pole 410, and the second subsection 320 is connected to the second pole 420. The first included angle is greater than 0° and less than 180°, and the specific value is not limited in the present disclosure. In some embodiments, the first included angle is 90°.

Figure 4:
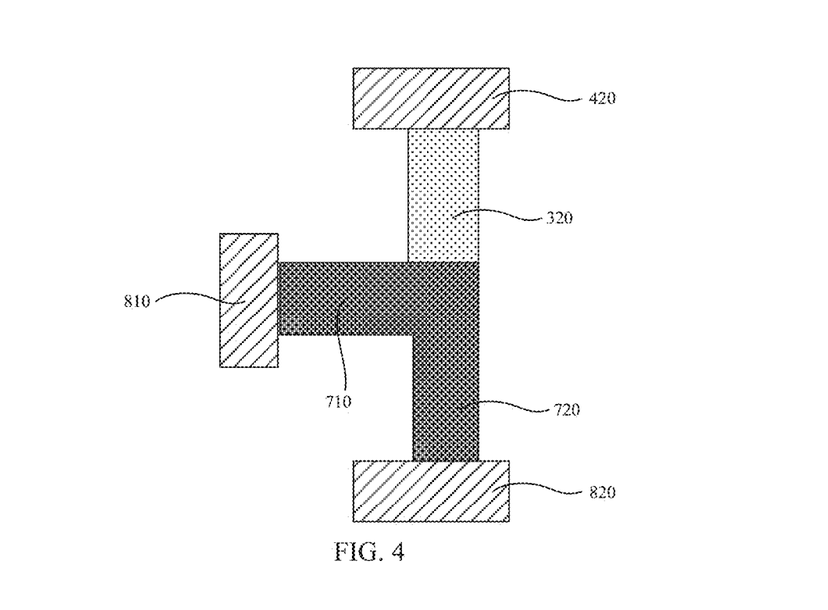
FIG. 4 is a schematic diagram of a stacked planar structure of first active layer and second active layer according to an exemplary embodiment of the present disclosure.

As shown in FIG. 4, the second active layer 700 includes a third subsection 710 and a fourth subsection 720. The third subsection 710 and the fourth subsection 720 have a second included angle. The third subsection 710 is connected to the third pole 810, and the fourth subsection 720 is connected to the fourth pole 820. The second included angle is greater than 0° and less than 180°, and the specific value is not limited in the present disclosure. In some embodiments, the second included angle is 90°. Orthographic projections of the second active layer 700 and the first active layer 300 on the base substrate 1 at least partially overlap, and the specific overlapping portion is not limited in the present disclosure.

Figure 5:
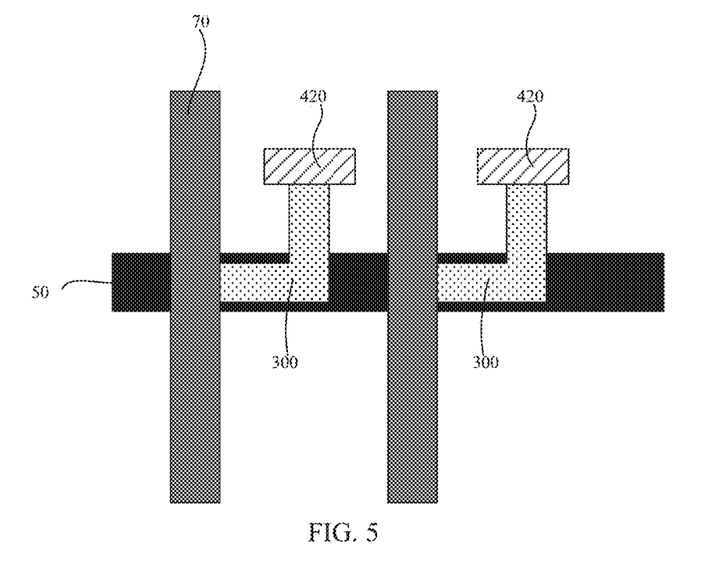
FIG. 5 is a schematic structural diagram of a first active layer, a first scan line and a first data line according to an exemplary embodiment of the present disclosure.
Figure 6:
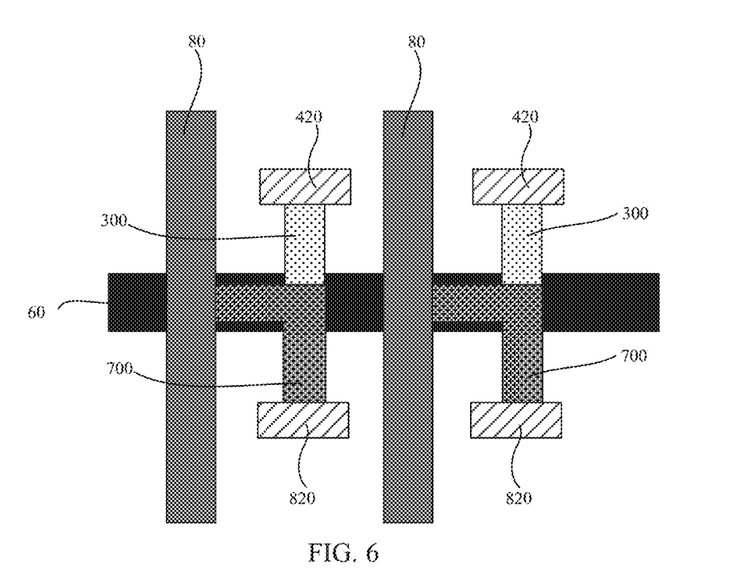
FIG. 6 is a schematic diagram of a stacked structure of a first active layer, a first scan line, a first data line, a second active layer, a second scan line and a second data line according to an exemplary embodiment of the present disclosure.

As shown in FIGS. 5 and 6, the array substrate further includes a first scan line 50, a second scan line 60, a first data line 70 and a second data line 80. In some embodiments, the first scan line 50 is arranged in the same layer as the first gate layer 100, and is connected to the first gate. The second scan line 60 is arranged in the same layer as the second gate layer 500, and is connected to the second gate. The first data line 70 is arranged in the same layer as the first source and drain layer, and is connected to the first pole 410. The second data line 80 is arranged in the same layer as the second source and drain layer, and is connected to the third pole 810 or the fourth pole 820.

Figure 7:
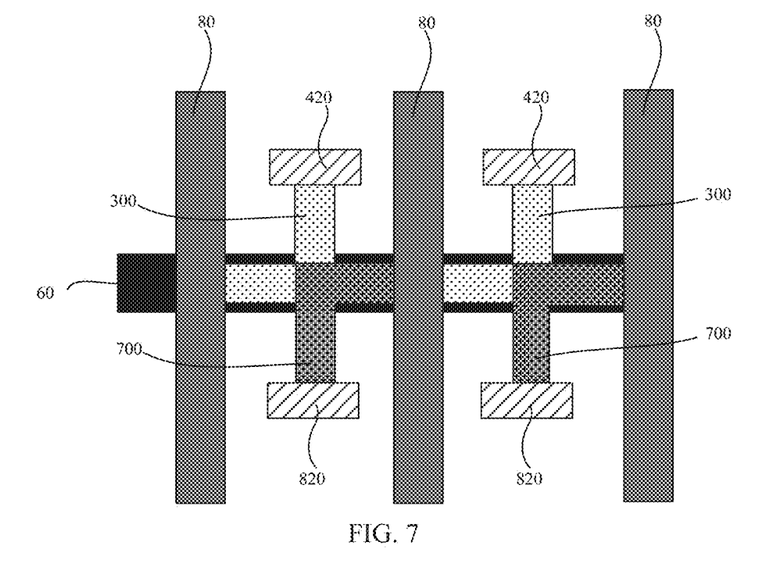
FIG. 7 is a schematic diagram of a stacked structure of a first active layer, a first scan line, a first data line, a second active layer, a second scan line and a second data line according to another exemplary embodiment of the present disclosure.

As shown in FIGS. 6 and 7, in some embodiments of the present disclosure, orthographic projections of the first scan line 50 and the second scan line 60 on the base substrate 1 at least partially overlap. Orthographic projections of the first data line 70 and the second data line 80 on the base substrate 1 at least partially overlap. In such structure, the first scan line 50 and the second scan line 60 are respectively arranged in different layers, the first data line 70 and the second data line 80 are respectively arranged in different layers, the orthographic projections of the first scan line 50 and the second scan line 60 on the base substrate 1 at least partially overlap, and the orthographic projections of the first data lines 70 and the second data lines 80 on the base substrate 1 at least partially overlap, which facilitates reducing the occupied area of the wiring on a plane, and improving the aperture ratio of the display panel. In some embodiments, the first scan line 50, the second scan line 60, the first data line 70 and the second data line 80 can use transparent metal wirings.

In connection manners shown in FIGS. 6 and 7, since the second active layer is stacked in different manners as the first active layer, the first scan line 50, the second scan line 60, the first data line 70 and the second data line 80 are slightly different in location distribution. In practical applications, when the array substrate is used to fabricate a display panel, the structure of the display panel is also different. For example, the structure of the display panel formed may be as shown in FIGS. 10 and 11.

As shown in FIGS. 8 to 11, embodiments of the present disclosure further provide a display panel including the array substrate mentioned above.

Figure 8:
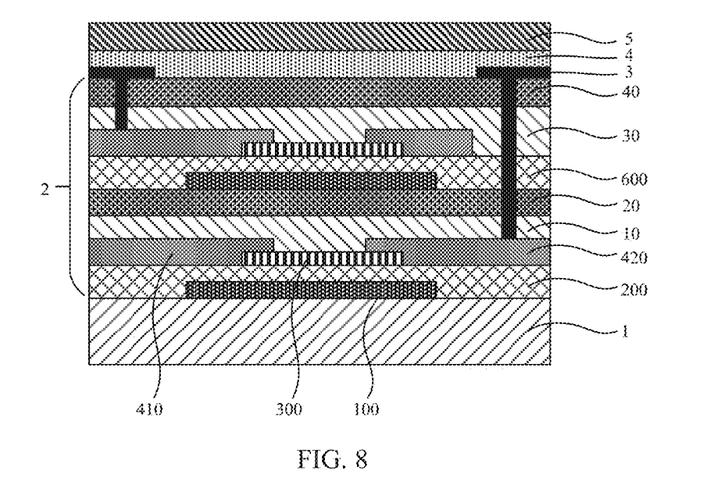
FIG. 8 is a schematic structural diagram of a display panel according to an exemplary embodiment of the present disclosure.
Figure 9:
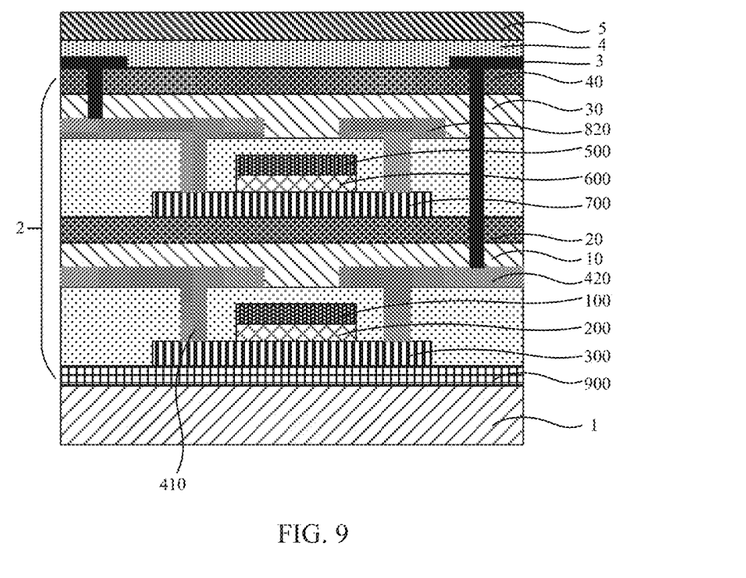
FIG. 9 is a schematic structural diagram of a display panel according to another exemplary embodiment of the present disclosure.

In some embodiments of the present disclosure, the display panel includes the array substrate mentioned above, as well as a pixel electrode 3, a liquid crystal layer 4 and a color film substrate 5. The number of pixel electrode 3 is multiple, and the multiple pixel electrodes 3 are arranged on a side of the thin film transistor group 2 away from the base substrate 1. Each pixel electrode 3 is connected to a thin film transistor. For example, the number of pixel electrodes 3 is two, among which, one pixel electrode 3 is connected to the second pole 420, and the other pixel electrode 3 is connected to the third pole 810 or the fourth pole 820. In this way, different thin film transistors in the thin film transistor group 2 can drive different pixels. The liquid crystal layer 4 is arranged on a side of the pixel electrode 3 away from the base substrate 1. The color film substrate is arranged on a side of the liquid crystal layer 4 away from the base substrate 1. The display panel has any of the array substrates described in the foregoing array substrate embodiments, specifically. FIG. 8 shows a display panel including a bottom gate structure thin film transistor, and FIG. 9 shows a display panel including a top gate structure thin film transistor. The display panel has the same beneficial effects as the array substrate, which is not repeated herein.

Figure 10:
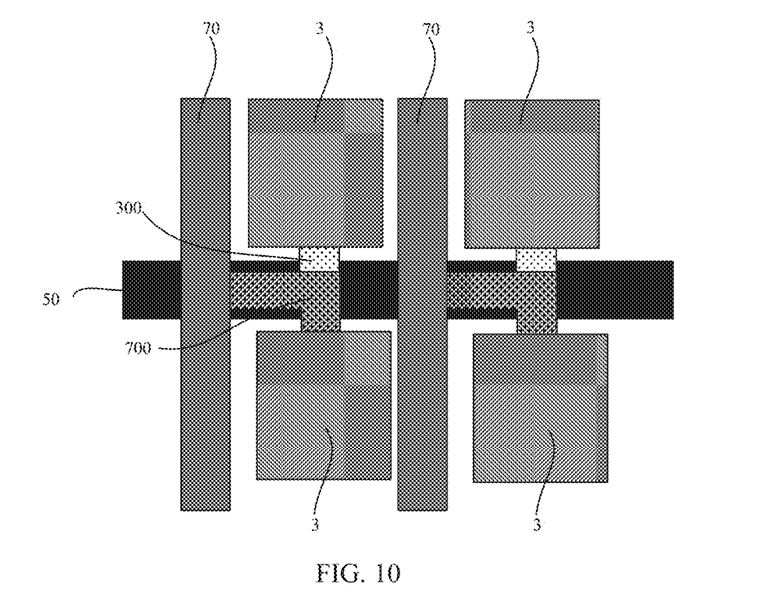
FIG. 10 is a schematic diagram of a planar structure of a display panel on which a pixel electrode is formed according to an exemplary embodiment of the present disclosure.
Figure 11:
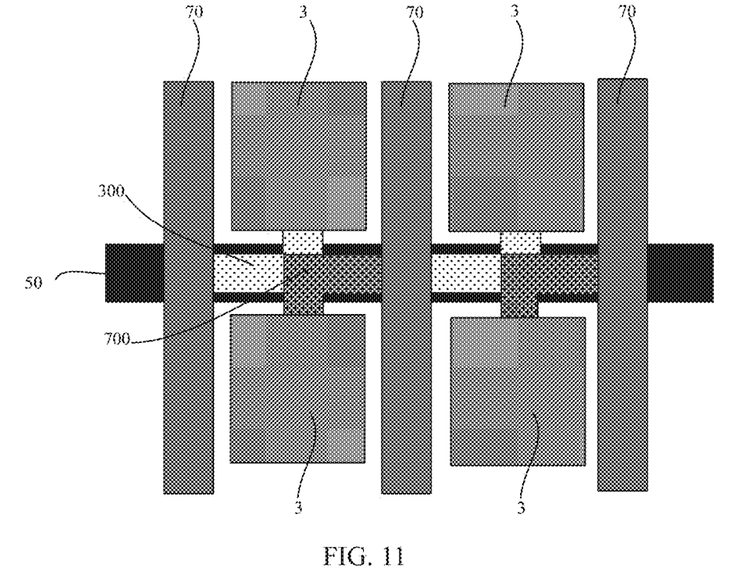
FIG. 11 is a schematic diagram of a planar structure of a display panel on which a pixel electrode is formed according to another exemplary embodiment of the present disclosure.

In the planar structures of the display panels shown in FIGS. 10 and 11, since the second active layer is stacked in different manners as the first active layer, the resulting display panels are also slightly different in structures. It should be noted that the aperture ratio of the display panels shown in FIGS. 10 and 11 can be improved.

Figure 12:
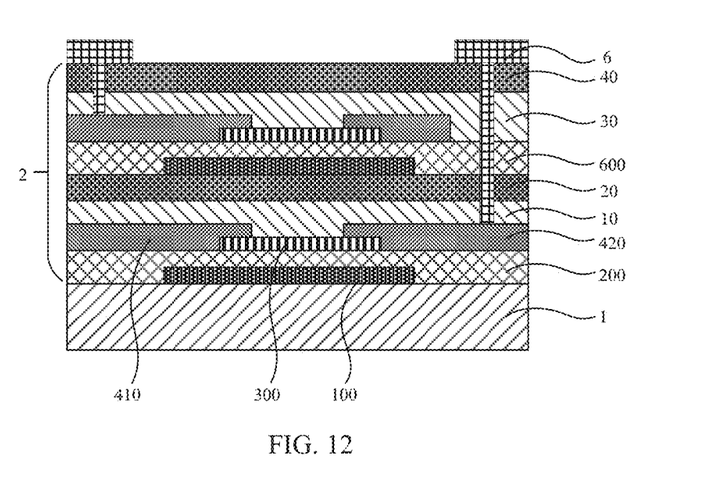
FIG. 12 is a schematic structural diagram of a display panel according to another exemplary embodiment of the present disclosure.
Figure 13:
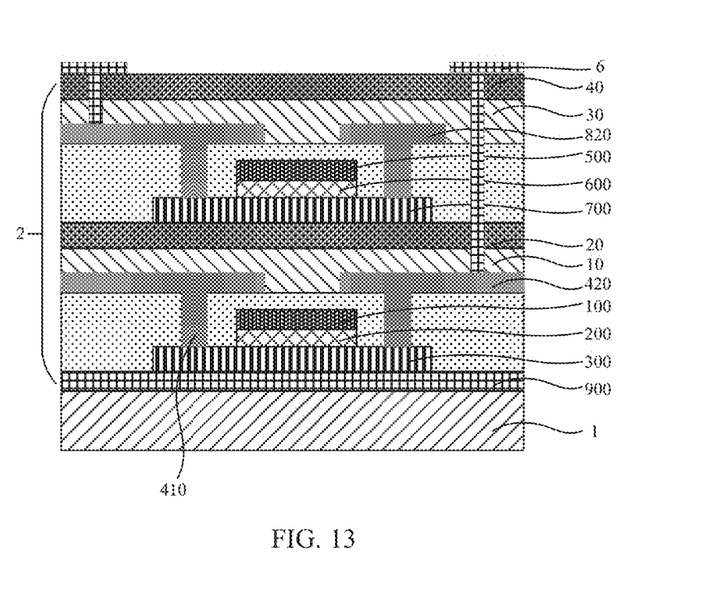
FIG. 13 is a schematic structural diagram of a display panel according to another exemplary embodiment of the present disclosure.

As shown in FIGS. 12 and 13, in some other embodiments of the present disclosure, a display panel includes the array substrate mentioned above, and a light-emitting device layer. The light-emitting device layer is arranged on the side of the thin film transistor group 2 away from the base substrate 1. The light-emitting device layer includes a plurality of light-emitting devices 6, and each light-emitting device 6 is connected to a thin film transistor. In this way, different thin film transistors in the thin film transistor group 2 can drive different light-emitting devices 6. The light-emitting device 6 may include an anode, a hole injection layer, a hole transport layer, a light-emitting layer, an electron transport layer, an electron injection layer, a cathode, and the like.

The array substrate provided by embodiments of the present disclosure can be used in liquid crystal displays, organic electroluminescence displays, and the like. Each thin film transistor stacked in the thin film transistor group 2 drives a liquid crystal pixel or a light-emitting device respectively. Compared with the arrangement in the same layer in the related art, the light transmittance and aperture ratio of the array substrate provided by the present disclosure are higher. For example, a 1500 PPI display formed by a glass substrate is taken as an example, the array substrate provided by the present disclosure can increase the aperture ratio by more than 20%.

Figure 14:
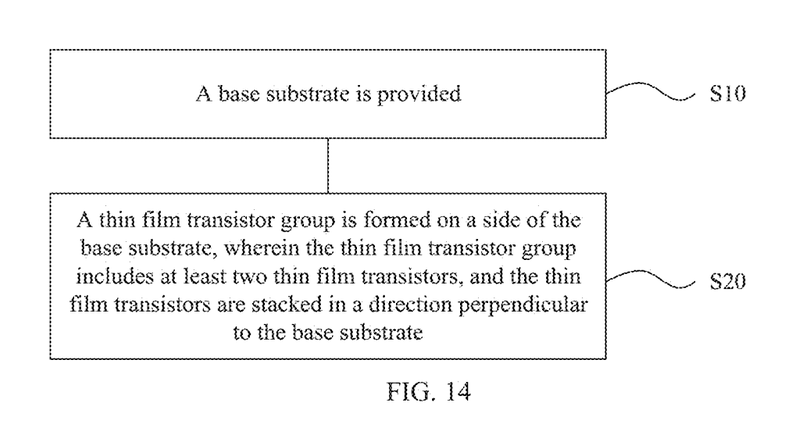
FIG. 14 is a schematic flowchart of a method for fabricating an array substrate according to an exemplary embodiment of the present disclosure.

As shown in FIG. 14, embodiments of the present disclosure also provide a method for fabricating an array substrate. The method includes following steps.

In a step S10, a base substrate 1 is provided.

In a step S20, a thin film transistor group 2 is formed on a side of the base substrate 1, the thin film transistor group 2 includes at least two thin film transistors, and the thin film transistors are stacked in a direction perpendicular to the base substrate 1.

In the method, forming the thin film transistor group 2 on a side of the base substrate 1 includes following steps.

In a step S100, a first thin film transistor is formed on a side of the base substrate 1.

In a step S200, a second thin film transistor is formed on a side of the first thin film transistor away from the base substrate 1.

The structures of the first thin film transistor and the second thin film transistor may be any one of the above-mentioned embodiments. That is, the first thin film transistor and the second thin film transistor may have a bottom gate structure or a top gate structure.

In some embodiments of the present disclosure, when the first thin film transistor and the second thin film transistor are bottom gate structures, a step of forming the first thin film transistor on a side of the base substrate 1 includes following steps.

In a step S110, a first gate layer 100 is formed on a side of the base substrate 1.

In a step S120, a first gate insulating layer 200 is formed on a side of the first gate layer 100 away from the base substrate 1, and the first gate insulating layer 200 covers a surface of the first gate layer 100.

In a step S120, a first active layer 300 is formed on a side of the first gate insulating layer 200 away from the base substrate 1.

In a step S120, a first source and drain layer is formed on a side of the first active layer 300 away from the base substrate. The first source and drain layer includes a first pole 410 covering one end of the first active layer 300 and a second pole 420 covering the other end of the first active layer 300.

A step of forming the second thin film transistor on a side of the first thin film transistor away from the base substrate 1 includes following steps.

In a step S210, a second gate layer 500 is formed on a side of the first thin film transistor away from the base substrate 1, and the second gate layer 500 includes a second gate.

In a step S220, a second gate insulating layer 600 is formed on a side of the second gate layer 500 away from the base substrate 1, and the second gate insulating layer 600 covers a surface of the second gate layer 500.

In a step S230, a second active layer 700 is formed on a side of the second gate insulating layer 600 away from the base substrate 1.

In a step S240, a second source and drain layer is formed on a side of the second active layer 700 away from the base substrate 1. The second source and drain layer includes a third pole 810 covering one end of the second active layer 700 and a fourth pole 820 covering the other end of the second active layer 700. Orthographic projections of the third pole 810 and the first pole 410 on the base substrate 1 at least partially overlap, orthographic projections of the fourth pole 820 and the second pole 420 on the base substrate 1 at least partially overlap, and the orthographic projection of the second pole 420 on the base substrate 1 is located at least partially outside the orthographic projection of the second thin film transistor on the base substrate 1.

When the first thin film transistor and the second thin film transistor have a top gate structure, similar preparation methods and preparation principles as described above can be used, which will not be described in detail herein.

The method for preparing an array substrate provided by embodiments of the present disclosure can prepare any of the array substrates provided in the above-mentioned embodiments of the array substrate. The principles, effects and details of the preparation method are described in detail in the above-mentioned embodiments of the array substrate, or can be reasonably deduced according to the description in the above array substrate, which will not be described in detail herein.

It should be noted that although the various steps of the methods of the present disclosure are depicted in a particular order in the drawings, this does not require or imply that the steps must be performed in that particular order, or that all illustrated steps must be performed in order to achieve the desired result. Additionally or alternatively, certain steps may be omitted, multiple steps may be combined into one step for execution, and/or one step may be decomposed into multiple steps for execution, etc., all of which should be considered as part of the present disclosure.

It should be understood that the present disclosure does not limit its application to the detailed structure and arrangement of components set forth in this specification. The present disclosure can have other embodiments and can be implemented and carried out in various ways. Variations and modifications of the foregoing fall within the scope of the present disclosure. It will be understood that the disclosure disclosed and defined in this specification extends to all alternative combinations of two or more of the individual features mentioned or evident in the text and/or drawings. All of these different combinations constitute various alternative aspects of the present disclosure. The embodiments of this specification illustrate the best mode known for carrying out the disclosure, and will enable those skilled in the art to utilize the disclosure.

What is claimed is:

1. An array substrate, comprising:
   a base substrate; and
   a thin film transistor group arranged on a side of the base substrate, wherein the thin film transistor group comprises at least two thin film transistors, and the thin film transistors are stacked in a direction perpendicular to the base substrate,
   wherein the thin film transistor group comprises a first thin film transistor and a second thin film transistor, the first thin film transistor comprises a first active layer and a first source and drain layer, and the second thin film transistor comprises a second active layer and a second source and drain layer; and
   wherein the first source and drain layer comprises a first pole and a second pole, the first active layer comprises a first subsection and a second subsection, the first subsection and the second subsection have a first included angle, the first subsection is connected to the first pole, and the second subsection is connected to the second pole.

2. The array substrate according to claim 1, wherein the first thin film transistor is arranged on a side of the base substrate, and the second thin film transistor is arranged on a side of the first thin film transistor away from the base substrate.

3. The array substrate according to claim 2, wherein the first thin film transistor further comprises:
- a first gate layer arranged on a side of the base substrate, wherein the first gate layer comprises a first gate; and
- a first gate insulating layer arranged on a side of the first gate layer away from the base substrate, wherein the first gate insulating layer covers a surface of the first gate layer;
- wherein the first active layer is arranged on a side of the first gate insulating layer away from the base substrate,
- the first pole covers one end of the first active layer, and the second pole covers the other end of the first active layer.

4. The array substrate according to claim 3, wherein the second thin film transistor further comprises:
- a second gate layer arranged on a side of the first thin film transistor away from the base substrate, wherein the second gate layer comprises a second gate; and
- a second gate insulating layer arranged on a side of the second gate layer away from the base substrate, wherein the second gate insulating layer covers a surface of the second gate layer;
- wherein the second active layer is arranged on a side of the second gate insulating layer away from the base substrate, and
- the second source and drain layer comprises a third pole covering one end of the second active layer and a fourth pole covering the other end of the second active layer, and wherein orthographic projections of the third pole and the first pole on the base substrate at least partially overlap, orthographic projections of the fourth pole and the second pole on the base substrate at least partially overlap, and the orthographic projection of the second pole on the base substrate is located at least partially outside an orthographic projection of the second thin film transistor on the base substrate.

5. The array substrate according to claim 2, wherein the first thin film transistor further comprises:
- a shielding layer arranged on a side of the base substrate, wherein the first active layer is arranged on a side of the shielding layer away from the base substrate;
- a first gate insulating layer arranged on a side of the first active layer away from the base substrate;
- a first gate layer arranged on a side of the first gate insulating layer away from the base substrate, wherein the first gate layer comprises a first gate; and
- a first interlayer insulating layer arranged on a side of the first gate layer away from the base substrate, wherein the first interlayer insulating layer covers a surface of the first gate layer away from the base substrate, and the first interlayer insulating layer covers side surfaces of the first gate layer and the first gate insulating layer;
- wherein the first source and drain layer comprises a first pole and a second pole, wherein the first pole covers a part of a surface of the first interlayer insulating layer away from the base substrate, passes through the first interlayer insulating layer, and is connected to one end of the first active layer; and wherein the second pole covers a part of the surface of the first interlayer insulating layer away from the base substrate, passes through the first interlayer insulating layer, and is connected to the other end of the first active layer.

6. The array substrate according to claim 5, wherein the second active layer is arranged on a side of the first thin film transistor away from the base substrate, and the second thin film transistor further comprises:
- a second gate insulating layer arranged on a side of the second active layer away from the base substrate;
- a second gate layer arranged on a side of the second gate insulating layer away from the base substrate, wherein the second gate layer comprises a second gate; and
- a second interlayer insulating layer arranged on a side of the second gate layer away from the base substrate, wherein the second interlayer insulating layer covers a surface of the second gate layer away from the base substrate, and the second interlayer insulating layer covers side surfaces of the second gate layer and the second gate insulating layer;
- wherein the second source and drain layer comprises a third pole and a fourth pole, wherein the third pole covers a part of a surface of the second interlayer insulating layer away from the base substrate, passes through the second interlayer insulating layer, and is connected to one end of the second active layer; and the fourth pole covers a part of the surface of the second interlayer insulating layer away from the base substrate, passes through the second interlayer insulating layer, and is connected to the other end of the second active layer; and wherein projections of the third pole and the first pole on the base substrate at least partially overlap, and an orthographic projection of the second pole on the base substrate is located at least partially outside an orthographic projection of the second thin film transistor on the base substrate.

7. The array substrate according to claim 4, wherein the thin film transistor group further comprises:
- a first passivation layer arranged between the first thin film transistor and the second thin film transistor, and arranged on a side of the first source and drain layer away from the base substrate; and
- a first planarization layer arranged on a side of the first passivation layer away from the base substrate.

8. The array substrate according to claim 4, wherein the thin film transistor group further comprises:
- a second passivation layer arranged on a side of the second source and drain layer away from the base substrate; and
- a second planarization layer arranged on a side of the second passivation layer away from the base substrate.

9. The array substrate according to claim 4, wherein the array substrate further comprises:
- a first scan line arranged in the same layer as the first gate layer, and connected to the first gate;
- a second scan line arranged in the same layer as the second gate layer, and connected to the second gate;
- a first data line arranged in the same layer as the first source and drain layer, and connected to the first pole; and
- a second data line arranged in the same layer as the second source and drain layer, and connected to the third pole or the fourth pole.

10. The array substrate according to claim 9, wherein orthographic projections of the first scan line and the second scan line on the base substrate at least partially overlap, and orthographic projections of the first data line and the second data line on the base substrate at least partially overlap.

11. The array substrate according to claim 10, wherein the first scan line, the second scan line, the first data line or the second data line are transparent metal lines.

12. The array substrate according to claim 1, wherein the second source and drain layer comprises a third pole and a fourth pole, the second active layer comprises a third subsection and a fourth subsection, the third subsection and the fourth subsection have a second included angle, the third subsection is connected to the third pole, the fourth subsection is connected to the fourth pole, and orthographic projections of the second active layer and the first active layer on the base substrate at least partially overlap.

13. The array substrate according to claim 4, wherein materials of the first active layer and the second active layer comprise IGZO.

14. A display panel, comprising:
an array substrate comprising:
a base substrate; and
a thin film transistor group arranged on a side of the base substrate, wherein the thin film transistor group comprises at least two thin film transistors, and the thin film transistors are stacked in a direction perpendicular to the base substrate;
a plurality of pixel electrodes arranged on a side of the thin film transistor group away from the base substrate, wherein each of the pixel electrodes is connected to one of the thin film transistors;
a liquid crystal layer arranged on a side of the pixel electrodes away from the base substrate; and
a color film substrate arranged on a side of the liquid crystal layer away from the base substrate;
wherein the thin film transistor group comprises a first thin film transistor and a second thin film transistor, the first thin film transistor comprises a first active layer and a first source and drain layer, and the second thin film transistor comprises a second active layer and a second source and drain layer; and
wherein the first source and drain layer comprises a first pole and a second pole, the first active layer comprises a first subsection and a second subsection, the first subsection and the second subsection have a first included angle, the first subsection is connected to the first pole, and the second subsection is connected to the second pole.

15. A display panel, comprising:
an array substrate comprising:
a base substrate; and
a thin film transistor group arranged on a side of the base substrate, wherein the thin film transistor group comprises at least two thin film transistors, and the thin film transistors are stacked in a direction perpendicular to the base substrate; and
a light-emitting device layer arranged on a side of the thin film transistor group away from the base substrate, wherein the light-emitting device layer comprises a plurality of light-emitting devices, and each of the light-emitting devices is connected to one of the thin film transistors;
wherein the thin film transistor group comprises a first thin film transistor and a second thin film transistor, the first thin film transistor comprises a first active layer and a first source and drain layer, and the second thin film transistor comprises a second active layer and a second source and drain layer; and
wherein the first source and drain layer comprises a first pole and a second pole, the first active layer comprises a first subsection and a second subsection, the first subsection and the second subsection have a first included angle, the first subsection is connected to the first pole, and the second subsection is connected to the second pole.

16. The display panel according to claim 14, wherein
the first thin film transistor is arranged on a side of the base substrate; and the second thin film transistor is arranged on a side of the first thin film transistor away from the base substrate;
wherein the first thin film transistor further comprises:
a first gate layer arranged on a side of the base substrate, wherein the first gate layer comprises a first gate; and
a first gate insulating layer arranged on a side of the first gate layer away from the base substrate, wherein the first gate insulating layer covers a surface of the first gate layer;
wherein the first active layer is arranged on a side of the first gate insulating layer away from the base substrate, the first pole covers one end of the first active layer, and the second pole covers the other end of the first active layer.

17. The display panel according to claim 16, wherein the second thin film transistor further comprises:
a second gate layer arranged on a side of the first thin film transistor away from the base substrate, wherein the second gate layer comprises a second gate; and
a second gate insulating layer arranged on a side of the second gate layer away from the base substrate, wherein the second gate insulating layer covers a surface of the second gate layer;
wherein the second active layer is arranged on a side of the second gate insulating layer away from the base substrate, and the second source and drain layer comprises a third pole covering one end of the second active layer and a fourth pole covering the other end of the second active layer, and wherein orthographic projections of the third pole and the first pole on the base substrate at least partially overlap, orthographic projections of the fourth pole and the second pole on the base substrate at least partially overlap, and the orthographic projection of the second pole on the base substrate is located at least partially outside an orthographic projection of the second thin film transistor on the base substrate.

18. The display panel according to claim 14, wherein
the first thin film transistor is arranged on a side of the base substrate, and the second thin film transistor is arranged on a side of the first thin film transistor away from the base substrate; and
wherein the first thin film transistor further comprises:
a shielding layer arranged on a side of the base substrate, wherein the first active layer is arranged on a side of the shielding layer away from the base substrate;
a first gate insulating layer arranged on a side of the first active layer away from the base substrate;
a first gate layer arranged on a side of the first gate insulating layer away from the base substrate, wherein the first gate layer comprises a first gate; and
a first interlayer insulating layer arranged on a side of the first gate layer away from the base substrate, wherein the first interlayer insulating layer covers a surface of the first gate layer away from the base substrate, and the first interlayer insulating layer covers side surfaces of the first gate layer and the first gate insulating layer;
wherein the first source and drain layer comprises a first pole and a second pole, wherein the first pole covers a part of a surface of the first interlayer insulating layer away from the base substrate, passes through the first interlayer insulating layer, and is connected to one end of the first active layer; and wherein the second pole covers a part of the surface of the first interlayer insulating layer away from the base substrate, passes through the first interlayer insulating layer, and is connected to the other end of the first active layer.

19. The display panel according to claim 18, wherein the second active layer is arranged on a side of the first thin film transistor away from the base substrate, and the second thin film transistor further comprises:
   a second gate insulating layer arranged on a side of the second active layer away from the base substrate;
   a second gate layer arranged on a side of the second gate insulating layer away from the base substrate, wherein the second gate layer comprises a second gate; and
   a second interlayer insulating layer arranged on a side of the second gate layer away from the base substrate, wherein the second interlayer insulating layer covers a surface of the second gate layer away from the base substrate, and the second interlayer insulating layer covers side surfaces of the second gate layer and the second gate insulating layer;
   wherein the second source and drain layer comprises a third pole and a fourth pole, wherein the third pole covers a part of a surface of the second interlayer insulating layer away from the base substrate, passes through the second interlayer insulating layer, and is connected to one end of the second active layer; and the fourth pole covers a part of the surface of the second interlayer insulating layer away from the base substrate, passes through the second interlayer insulating layer, and is connected to the other end of the second active layer; and wherein projections of the third pole and the first pole on the base substrate at least partially overlap, and an orthographic projection of the second pole on the base substrate is located at least partially outside an orthographic projection of the second thin film transistor on the base substrate.

20. The display panel according to claim 14, wherein the second source and drain layer comprises a third pole and a fourth pole, the second active layer comprises a third subsection and a fourth subsection, the third subsection and the fourth subsection have a second included angle, the third subsection is connected to the third pole, the fourth subsection is connected to the fourth pole, and orthographic projections of the second active layer and the first active layer on the base substrate at least partially overlap.

* * * * *